United States Patent [19]

Chantepie

[11] Patent Number: 4,902,909

[45] Date of Patent: Feb. 20, 1990

[54] FLIP-FLOP ARRANGEMENT FOR A DIVIDE-BY-2 FREQUENCY DIVIDER COMPRISING MASTER-SLAVE TYPE MEMORY ELEMENTS

[75] Inventor: Bernard Chantepie, Chevry, France

[73] Assignee: U.S. Philips Corp., New York, N.Y.

[21] Appl. No.: 313,670

[22] Filed: Feb. 21, 1989

[30] Foreign Application Priority Data

Feb. 26, 1988 [FR] France ................................ 88 02374

[51] Int. Cl.[4] ...................... H03K 3/037; H03K 23/52; H03K 3/284
[52] U.S. Cl. .............................. 307/247.1; 307/272.1; 307/272.2; 307/279; 377/119; 377/121; 377/127
[58] Field of Search ............... 307/247.1, 272.1, 272.2, 307/279; 377/119, 121, 127

[56] References Cited

U.S. PATENT DOCUMENTS

| 4,300,060 | 9/1981 | Yu | 307/272.2 |
| 4,544,851 | 10/1985 | Conrad et al. | 307/279 |
| 4,801,821 | 1/1989 | Prevost et al. | 307/247.1 |

FOREIGN PATENT DOCUMENTS

| 0258514 | 11/1987 | Japan | 307/272.2 |
| 0482010 | 8/1975 | U.S.S.R. | 307/247.1 |

Primary Examiner—Stanley D. Miller
Assistant Examiner—Nancy Thai
Attorney, Agent, or Firm—Steven R. Biren

[57] ABSTRACT

A flip-flop (40) for a divide-by-2 frequency divider having a first stage (50) formed by two master-slave-type memory elements (10a, 10b) each having a two-input NOR gate (20a, 20b), and by a second stage (60) with 2 NOR gates (61, 62) connected as an RS flip-flop. The memory elements (10a, 10b) also include an enhancement-type MESFET transistor (30a, 30b), the gates (Ga, Gb) and the drains (Da, Db) of said transistors (30a, 30b) being coupled to the respective inputs of the NOR-gates (20a, 20b).

2 Claims, 1 Drawing Sheet ively, via a conduction path of a first and a second switch, respectively, whereby second gate inputs of the third and fourth logic gates and control inputs of switches are coupled to said input terminal.

FLIP-FLOP ARRANGEMENT FOR A DIVIDE-BY-2 FREQUENCY DIVIDER COMPRISING MASTER-SLAVE TYPE MEMORY ELEMENTS

BACKGROUND OF THE INVENTION

The invention relates to flip-flop arrangement for halving a frequency of a signal received on an input terminal. A flip-flop arrangement of this kind is known from IEEE Electron Device Letters Vol. EDL-4, No. 10, October 1983, pp. 377–379. The known arrangement comprises five two-inputs NOR-gates and one three-inputs NOR-gate, each gate comprising a load-transistor and two or three driver transistors. General problems that designers of VLSI circuitry have to cope with relate to the reduction of the number of components in a circuit for performing a predetermined function and to the reduction of power consumption, that, among others, is associated with the number of components and the number of current conduction paths between the supply terminals. These problems should preferably be solved without degrading the performance and the dynamic characteristics of the circuitry.

SUMMARY OF THE INVENTION

It is an object of the invention to provide a flip-flop arrangement for a divide-by-2 frequency divider having fewer components than the prior art flip-flop arrangement and fewer current conduction paths between the supply terminals. Therefore, a flip-flop arrangement according to the invention is characterized in that the arrangement comprises:

a RS-flip-flop with a first and a second logic gate that have their first gate inputs mutually intercoupled to their gate outputs;

a third logic gate and a fourth logic gate having respective gate outputs coupled to a second gate input of the first and the second logic gate, respectively, and having first gate inputs coupled to a gate output of the second and first logic gate, respectively, via a conduction path of a first and a second switch, respectively, whereby second gate inputs of the third and fourth logic gates and control inputs of switches are coupled to said input terminal. The structure comprising the third (fourth) logic gate having the one gate input connected to a conduction path of the first (second) switch, a control electrode whereof is coupled to the other gate input, behaves as a master-slave flip-flop as will be described hereinbelow. In case the flip-flop arrangement is realized comprising MESFET GaAs transistors, preferably the logic gates each comprise a NOR-gate and the switches each comprise a normally-off enhancement FET. In MESFET realization, the Applicant has found a power consumption of about 0.75 mW at 1 GHz.

BRIEF DESCRIPTION OF THE DRAWINGS

An embodiment of the invention will now be described in more detail, by way of non-limitative example, with reference to the accompanying drawings.

DESCRIPTION OF THE PREFERRED EMBODIMENTS

Figure 1:
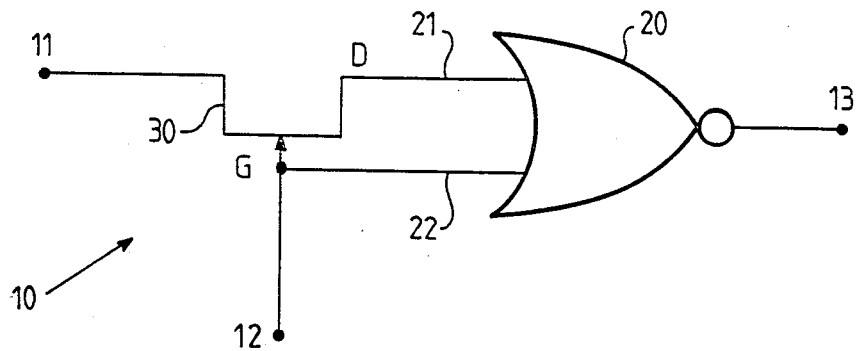
FIG. 1 is the diagram of a master-slave memory element used in a flip-flop arrangement in accordance with the invention.

FIG. 1 shows the diagram of a master-slave-type memory element 10 comprising a NOR gate 20 having two inputs 21, 22 and a MESFET transistor 30 of the enhancement (N-off) type, which transistor has its gate electrode G and drain D coupled to an input 21 and an input 22 of the NOR gate 20, respectively. This NOR gate 20 comprises in known manner two N-off MESFET transistors and a resistor (not shown). It can be demonstrated that the memory element 10 shown in FIG. 1 operates in the same way as a master-slave-type memory element with zero reset of the slave. Indeed:

When a logic 1 level is applied to 12 the output 13 will be 0. During this operation the intrinsic capacitance Cgs of the MESFET transistor (which functions as the master), which transistor is situated at the input 21 of the NOR gate 20 (which functions as the slave), is charged, so that the logic level (E) at the input 11 will appear at 21.

When a logic 0 level is applied to 12 the transistor 10 is turned off, and the logic level at 11 cannot be transferred to 21. The NOR gate operates between 0 and the logic level at 21, i.e. the logic level (E) appearing at 11 during the preceding phase. Consequently, the level $\overline{E}$ will appear at the output 13 of the NOR gate.

Figure 2:
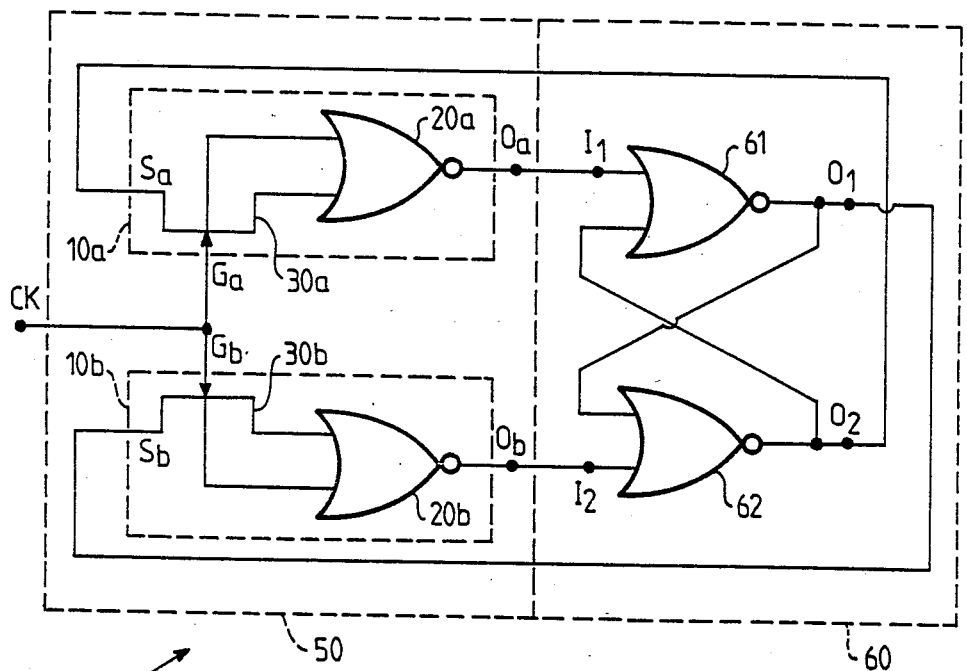
FIG. 2 is a diagram of a flip-flop arrangement for a divide-by-2 frequency divider in accordance with the invention.

FIG. 2 shows a flip-flop 40 for a divide-by-2 frequency divider, comprising a first stage 50 formed by two master-slave-type memory elements 10a, 10b, each comprising a two-input NOR-gate 20a, 20b, and a second stage 60 formed by two NOR-gates 61, 62 in RS arrangement. As in shown in FIG. 2, said memory elements 10a, 10b are identical to those shown in FIG. 1. They are coupled via the respective gate electrodes Ga, Gb of their enhancement-type MESFET transistors 30a, 30b, the resulting common terminal constituting the clock input CK of the flip-flop, as in indicated in FIG. 2. The outputs Oa, Ob of the memory elements 10a, 10b are coupled to one of the respective inputs I$_1$, I$_2$, respectively, of the NOR gates 61, 62 of the second stage 60.

Further, the sources Sa, Sb of the transistors 10a, 10b are cross-coupled to one of the outputs O$_1$, O$_2$, respectively, of the NOR-gates 61, 62.

The flip-flop arrangement shown in FIG. 2 is realized by means of enhancement-type MESFET transistors whose threshold voltage V$_T$ is 0.2 V and whose transconductance g$_m$ is 200 mS/mm. They operate with a current I$_{DS}$ of approximately 5.7 mA for a width W of 100 μm, while V$_{GS}$=0.7 V, V$_{DS}$=2 V and the gate length is 0.7 μm.

The two transistors 30a and 30b have a width of 5 μm. The gates 2a, 2b are constituted by transistors having a width of 1.5 μm and a 3.5 kΩ resistor. The gates 61 and 62 comprise transistors of 20 μm width and a 2.5 kΩ resistor.

I claim:
1. Flip-flop arrangement for halving a frequency of a signal received on an input terminal, comprising:
a RS-flip-flop with a first and a second logic gate that have their first gate inputs mutually intercoupled to their gate outputs;
a third logic gate and a fourth logic gate having respective gate outputs coupled to a second gate input of the first and the second logic gate, respectively, and having first gate inputs coupled to a gate output of the second and first logic gate, re- spectively, via a conduction path of a first and a second switch, respectively the second gate inputs of the third and fourth logic gates and control inputs of switches being coupled to said input terminal.

2. Flip-flop arrangement as claimed in claim 1, wherein the logic gates each comprise a NOR-gate, the switches each comprising an enhancement field effect transistor.

* * * * *